United States Patent
Kushida (10) Patent No.: US 6,855,983 B1
(45) Date of Patent: Feb. 15, 2005

(54) SEMICONDUCTOR DEVICE HAVING REDUCED ON RESISTANCE

(75) Inventor: Tomoyoshi Kushida, Seto (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/435,766

(22) Filed: Nov. 8, 1999

(30) Foreign Application Priority Data

| Nov. 10, 1998 | (JP) | 10-319481 |
| Jan. 13, 1999 | (JP) | 11-006395 |
| Feb. 24, 1999 | (JP) | 11-046607 |

(51) Int. Cl.⁷ .................. H01L 29/76; H01L 29/94; H01L 27/095; H01L 29/861; H01L 31/062
(52) U.S. Cl. .............. 257/331; 257/329; 257/330; 257/471; 257/476; 257/481
(58) Field of Search .................. 257/565, 329, 257/330, 331, 471, 481, 476

(56) References Cited

U.S. PATENT DOCUMENTS

| 5,309,002 A | * | 5/1994 | Terashima | 257/331 |
| 5,365,102 A | * | 11/1994 | Mehrotra et al. | 257/471 |
| 5,581,100 A | * | 12/1996 | Ajit | 257/331 |
| 5,661,322 A | * | 8/1997 | Williams et al. | 257/331 |
| 5,998,834 A | * | 12/1999 | Williams et al. | 257/330 |
| 6,002,143 A | * | 12/1999 | Terasawa | 257/331 |
| 6,078,090 A | * | 6/2000 | Williams et al. | 257/476 |

FOREIGN PATENT DOCUMENTS

| JP | 4-233281 | * | 8/1992 | 257/459 |
| JP | 05-048117 A | | 2/1993 | 257/329 |
| JP | 05-0243561 A | | 9/1993 | 257/329 |
| JP | 05-275685 A | | 10/1993 | 257/329 |
| JP | A-08213613 | | 8/1996 | |
| JP | A-08316470 | | 11/1996 | |
| JP | 09-246545 A | | 9/1997 | 257/329 |
| JP | 10-093083 A | | 4/1998 | 257/329 |

* cited by examiner

Primary Examiner—Steven Loke
(74) Attorney, Agent, or Firm—Oliff & Berridge, PLC (57) ABSTRACT

A trench gate type semiconductor device has an ON resistance that has been reduced. The device has a drain electrode on one side of the substrate and has a drift region, channel region, source region, and a source electrode on the other side. The channel region is sandwiched between a trench gate region covered with insulating film. Current passes when a positive bias voltage is applied to the trench region, and current is cut off when a negative bias voltage is applied.

5 Claims, 10 Drawing Sheets

SEMICONDUCTOR DEVICE HAVING REDUCED ON RESISTANCE

The disclosures of Japanese Patent Application Nos. HEI 10-319481 filed on Nov. 10, 1998, 11-6395 filed on Jan. 13, 1999 and 11-46607 filed on Feb. 24, 1999 including their specifications, drawings, claims and abstracts are incorporated herein by reference in their entireties.

BACKGROUND OF THE INVENTION

1. Field of Invention

The present invention relates generally to a semiconductor device and more particularly to a semiconductor device having low ON resistance.

2. Description of Related Art

Semiconductor devices having low ON resistance are used as power switching elements. For example, Japanese Patent Application No. HEI 8-213613 discloses a semiconductor device provided with $n^+$-type drain region, n drift region, $n^+$-type source region, and source electrode in that sequence on a drain electrode. The device is further provided with a trench gate region covered with insulating film so as to surround the n drift region from both sides.

In such construction, when negative bias voltage is applied to a gate electrode, the entire n drift region interposed between the trench gate region becomes depleted, and a potential barrier against electrons is formed on the entire $n^+$-type source region resulting in current cutoff. On the other hand, when the negative potential of the gate electrode is decreased and potential voltage is applied, the potential barrier becomes small. As a result, electrons move from the $n^+$-type source region to the $n^+$-type drain region, and thus current flows. In such semiconductor devices, the channel in the ON-state is formed at the entire portion sandwiched between the trench gate rather than as an inversion layer of the gate oxide film interface, so that the mobility of the carrier is increased.

It is possible to increase the mobility of the carrier by forming the entire current path with n-type, without containing pn junction in the current path. However, in such case, the semiconductor is of unipolar type wherein only the electrons function as carriers. Therefore, the carrier density is insufficient and it is difficult to further reduce the ON resistance.

Schottky type diodes are known as devices having low ON voltage (ON resistance). However, Schottky type diodes are not used for various devices since the voltage resistance of the diode is not enough.

SUMMARY OF THE INVENTION

The present invention has been made in the light of the drawbacks of the above-mentioned related technology, and it is an object of the present invention to provide a useful semiconductor device capable of reducing the ON resistance.

To achieve the above and/or other objects, in accordance with one aspect of the present invention, there is provided a bipolar semiconductor device provided with a drain electrode, a drain region having a first conductive type and disposed on the drain electrode, a drift region having a second conductive type and disposed on the drain region, a channel region having the second conductive type and disposed on the drift region, a gate region provided so as to surround at least a portion of the channel region via an insulating film, a source region having the second conductive type and disposed on the channel region, and a source electrode connected to the source region.

The mobility of the carrier is increased by making the conductive types of the drift region, channel region, and the source region the same, thus reducing the ON resistance. Further, by providing the drain region having a different type of conductivity, the electrons and the holes both function as carriers, increasing the carrier density, and leading to further reduction of ON resistance.

According to another aspect of the present invention, there is provided a useful device using Schottky type diode with low ON voltage (ON resistance). Since an impurity concentration in a channel region is not greater than that in a cathode region, the voltage resistance is increased.

BRIEF DESCRIPTION OF THE DRAWINGS

The invention will be described in conjunction with the following drawings in which line reference numerals designate like elements.

DETAILED DESCRIPTION OF PREFERRED EMBODIMENTS

Embodiments of the present invention will be described with reference to the attached drawings.

Figure 1A:
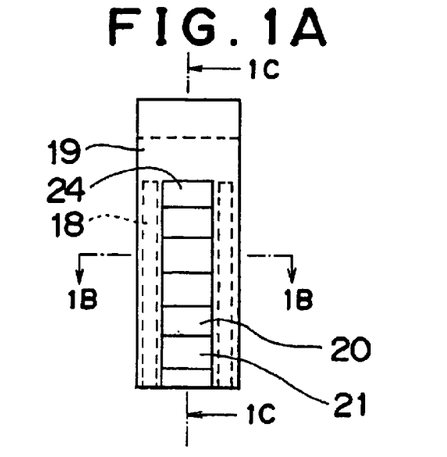
FIG. 1A is a plan view of a semiconductor device according to an embodiment of the present invention.
Figure 1B:
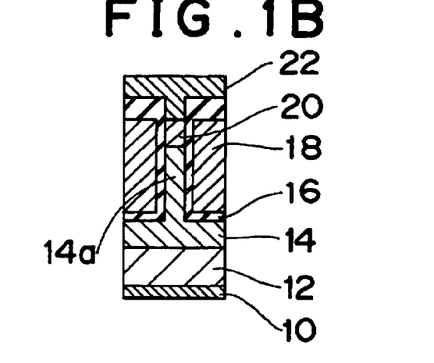
FIG. 1B is a sectional view of the semiconductor device according to the embodiment of the present invention taken along line 1B—1B in FIG. 1A.
Figure 1C:
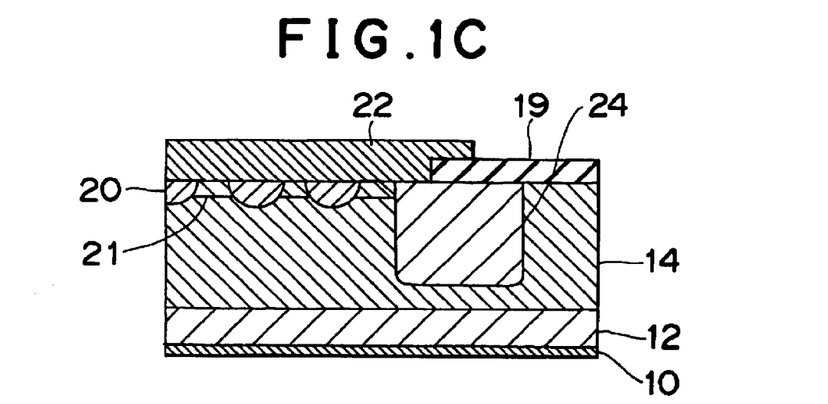
FIG. 1C is a sectional view of the semiconductor device according to the embodiment of the present invention taken along line 1C—1C in FIG. 1A.

Construction of a semiconductor according to a first embodiment is shown in FIGS. 1A through 1C. FIG. 1A is a plan view, FIG. 1B is a sectional view taken along line 1B—1B in FIG. 1A, and FIG. 1C is a cross-sectional view taken along line 1C—1C in FIG. 1A. In FIG. 1A, a source electrode is omitted for convenience.

As shown in the figures, a drain electrode 10 and an n drift region 14 are provided below and above a $p^+$-type substrate 12, respectively, in the semiconductor device of the present embodiment. Further, a trench gate region 18 (an n-type, for example) is disposed such that it surrounds a portion of the n drift region 14 (which functions as an n channel region 14a). The trench gate region 18 is covered by an insulating film 16. An $n^+$-type source region 20 is disposed on the n channel region 14a, and a source electrode 22 having a T-shaped cross-section contacts the $n^+$-type source region 20. Further, as understood from FIGS. 1A and 1C, a $p^+$-type source region 21 adjacent to the $n^+$-type source region 20 is connected to the n drift region 14 (more specifically, the n channel region 14a), and the $p^+$-type source region 21 is connected to the source electrode 22. The $p^+$-type source region 21 is for easily drawing holes, which are minority carriers, to the source electrode side. A $p^+$-type region 24 in FIG. 1C is formed deeper than the trench gate region 18 to prevent leakage current from trench gate end. Also, an insulating film 19 is disposed on the $p^+$-type region 24.

With such construction, when voltage is applied between the drain electrode 10 and the source electrode 22 and negative bias voltage is applied to a gate electrode connected to the trench gate region 18, the entire n channel region 14a sandwiched between the trench gate region becomes depleted, and current is cut off. In the present embodiment, the $p^+$-type source region 21 is connected to the n channel region 14a and the source electrode 22 is connected to the $p^+$-type source region 21. Therefore, it is possible to quickly draw holes, which are minority carriers, from the n-type channel region 14a via the $p^+$-type source region 21, thereby realizing a high-speed switching.

Further, when voltage is applied between the drain electrode 10 and the source electrode 22 and positive voltage is applied to the gate electrode, the depletion layer of the n-type channel region 14a disappears and the electrons are injected from the $n^+$-type source region 20 to the n drift region 14. Accordingly, holes which are minority carriers are injected from the $p^+$-type substrate 12 to the n drift region 14. Therefore, the semiconductor device of the present embodiment acts as a bipolar transistor wherein the electron, which is a majority carrier, and the hole, which is a minority carrier, both function as carriers. As a result, the carrier density is increased and the ON resistance is reduced.

Figure 2:
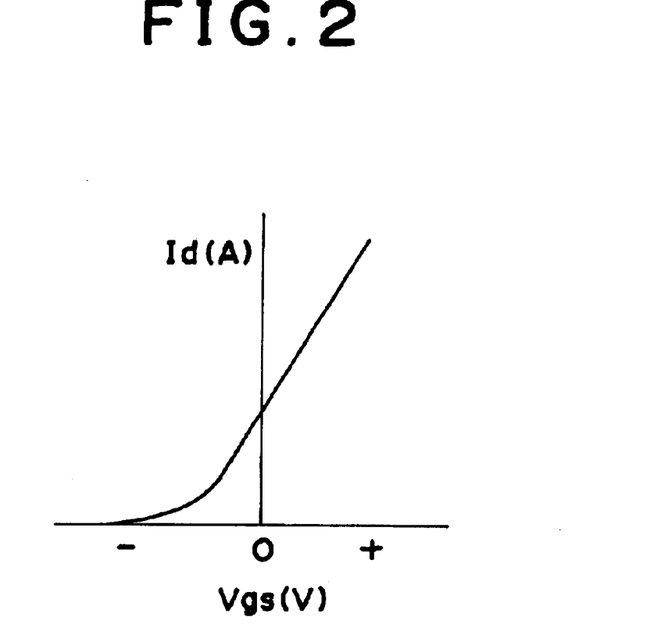
FIG. 2 is a graph indicating characteristics of the semiconductor device of the embodiment when it is of a normally ON type.

The characteristics described above are illustrated in FIG. 2. In the figure, the axis of abscissas indicates a gate voltage and the axis of ordinates indicates a drain current. This is what is called a normally ON type, wherein the drain current flows even when bias is not applied to the gate electrode. The drain current increases when positive bias voltage is applied to the gate electrode, and the drain current is cut off when a predetermined negative bias is applied.

Further, in the construction of the present embodiment, the trench gate region 18 may be made of p-type instead of n-type, and a distance between adjacent trench gate regions 18, that is, a width of the n-type channel region 14a may be made sufficiently small so as to construct a normally OFF type transistor, wherein current is cut off in a zero bias state where bias is not applied to the gate electrode (the state where ground potential is applied). When the trench gate region 18 is p-type, the electrons in the n-type channel region 14a sandwiched between the trench gate region 18 via the insulating film 16 are eliminated from the boundary between the trench gate region due to the difference between work functions of p-type and n-type. As a result, a depletion layer is formed in the n channel region 14a. If the distance between the trench gate regions 18 is sufficiently small, the depletion layers generated at respective borders with the trench gate region 18 become connected in the n channel region 14a. Accordingly, the depletion layer is formed over the entire n channel region 14a and the current is cut off.

Figure 3:
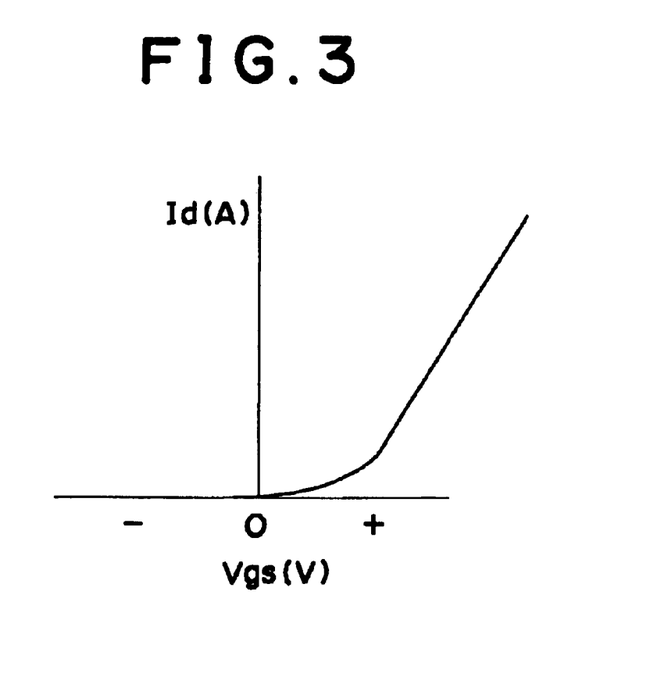
FIG. 3 is a graph indicating characteristics of the semiconductor device of the embodiment when it is of a normally OFF type.

FIG. 3 illustrates the characteristic when the trench gate region 18 is made of p-type and the distance between adjacent trench gate regions 18 is made sufficiently small. Drain current does not flow because the depletion layer is formed over the entire n channel region 14a, as already mentioned, even in a state where bias is not applied to the gate electrode. When positive bias is applied to the gate electrode, the depletion layer of the n channel region 14 disappears. Accordingly, electrons and holes conduct, and current flows.

Figure 4:
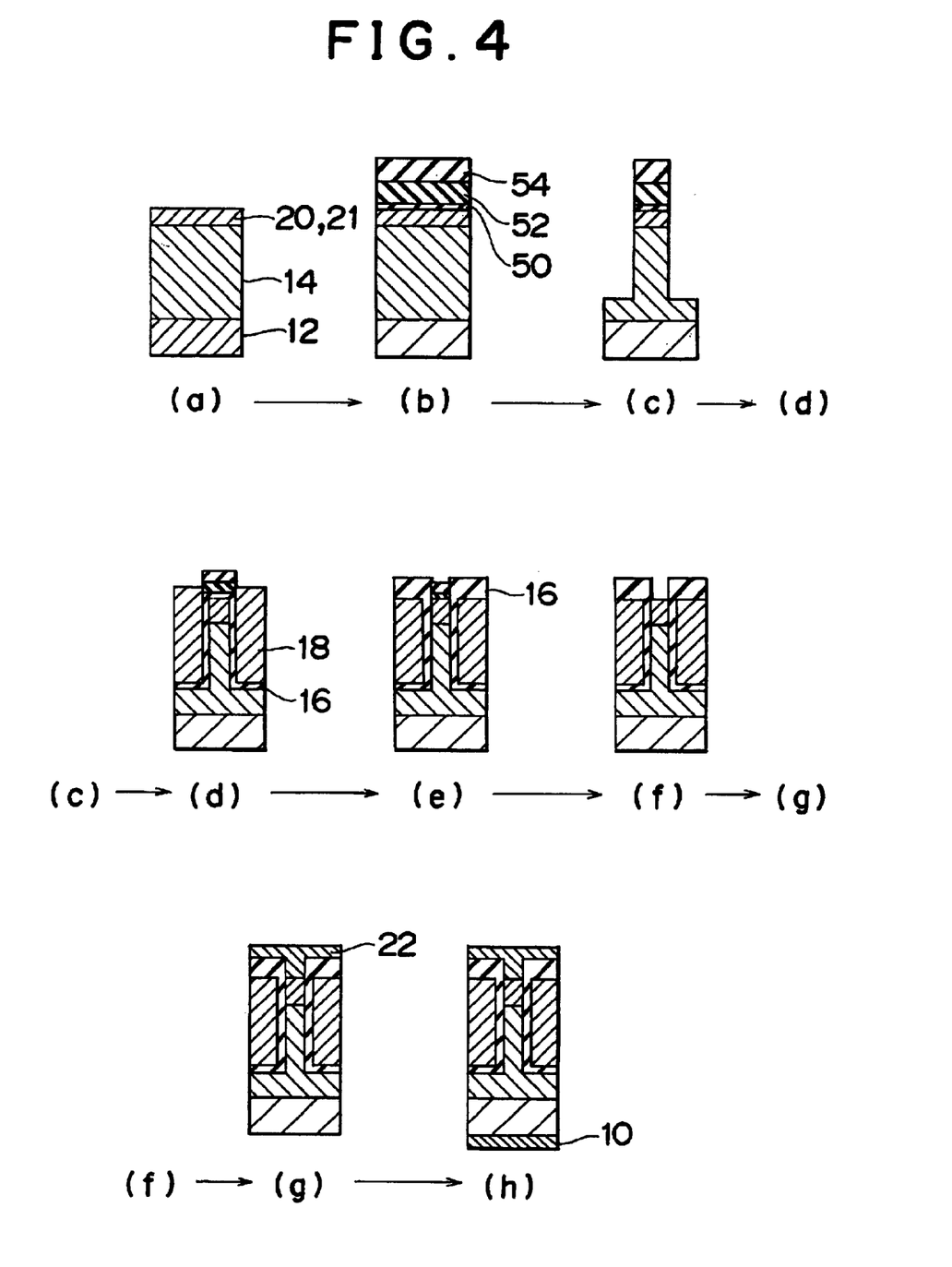
FIG. 4 is an explanatory drawing indicating a manufacturing method of an embodiment of the present invention.

FIG. 4 illustrates a manufacturing method of the semiconductor device of the present embodiment. First, the n drift region 14 is epitaxially grown on the $p^+$-type silicon substrate 12, and the $n^+$-type source region 20, the $p^+$-type source region 21, and the $p^+$-type region 24 (not shown, see FIG. 1C) are sequentially formed by ion implantation and diffusion (a). The $n^+$-type source region 20 and the $p^+$-type source region 21 may be formed at a thickness of approximately 1 μm and the $p^+$-type region 24 may be formed at a thickness of approximately 7 μm. Also, the $n^+$-type source region 20 and the $p^+$-type source region 21 are formed alternately (forming stripes as shown in FIG. 1C). Then, the surface is thermally oxidized to form an oxide film 50 (50 nm), and a nitride film 52 (200 nm) and an oxide film 54 (200 nm) are formed sequentially by a CVD method (b).

Then, a resist mask is formed by a photolithography process, and the mask thus formed is used to sequentially dry etch the oxide film 50, the nitride film 52, and the oxide film 54. Further, the oxide film 54 is used as a mask to etch the n-type drift region 14, and a trench structure is formed (c).

Then, a side wall of the trench is temporarily oxidized by thermal oxidation to form an oxide film (50 nm). The oxide film is then removed, e.g., by hydrofluoric acid. Further, the side wall of the trench is chemically dry etched (50 nm) and then a gate oxide film (insulating film) 16 is formed by thermal oxidation. After forming the gate oxide film 16, the trench gate region 18 is formed by a CVD method using, e.g., polycrystalline silicon. Then, the entire surface is etched back to the oxide film 52 to form the gate electrode (d). Further, to make the silicon device a normally OFF type, boron is diffused in the trench gate to make it $p^+$-type.

Next, the oxide surface 54 on the surface is removed by dry etching. At this time, an upper face and wall surface of the gate oxide film 16 are not etched because they are covered by the oxide film 52 and the trench gate region 18. Then, the surface of the trench gate region is oxidized (400 nm) by thermal oxidation (e).

Further, the oxide film 52 and the oxide film 50 are removed by dry etching (f). Then, a sputtering method is used to form the source electrode 22 on the $n^+$-type source region 20 and the $p^+$-type source region 21. The source electrode 22 is processed into a desired shape by photolithography and etching (g). Finally, the drain electrode 10 (Ti/Ni/Au) is formed on the opposite side of the $p^+$-type substrate by a sputtering method (h).

Figure 5:
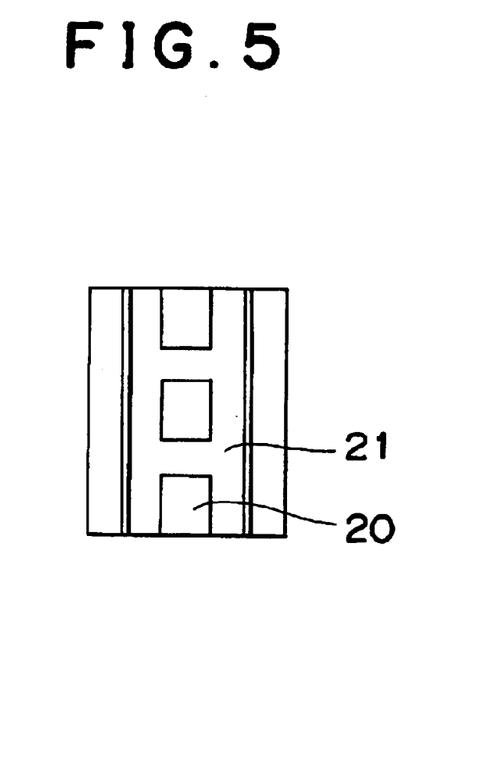
FIG. 5 is a plan view of a semiconductor device according to an embodiment of the present invention.

An embodiment of the present invention has been described above. However, an arrangement of the $n^+$-type source region 20 and the $p^+$-type source region 21 is not limited to the one shown in FIG. 1A, and other arrangements are possible. For example, as shown by the plan view in FIG. 5 (the source electrode is omitted for the convenience of explanation), the $p^+$-type source region 21 may be arranged so as to surround the $n^+$-type source region 20.

Figure 6:
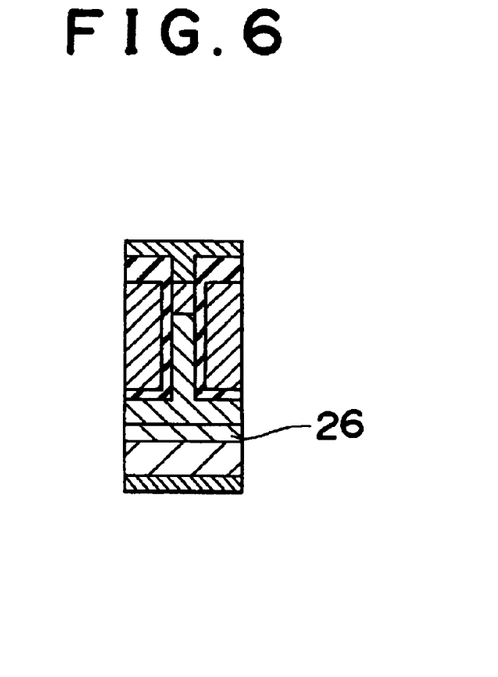
FIG. 6 is a sectional view of a semiconductor device according to an embodiment of the present invention.

Further, as shown in FIG. 6, an $n^+$-type buffer layer 26 may be provided between the $p^+$-type substrate 12 and the n drift region 14. This allows the n-type drift region 14 to be thinly formed.

Figure 7A:
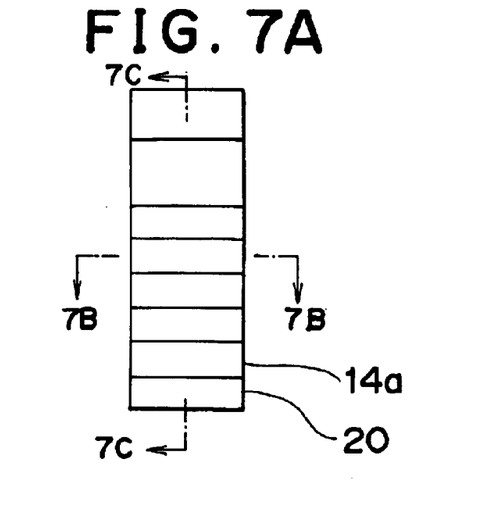
FIG. 7A is a plan view of a semiconductor device according to an embodiment of the present invention.
Figure 7B:
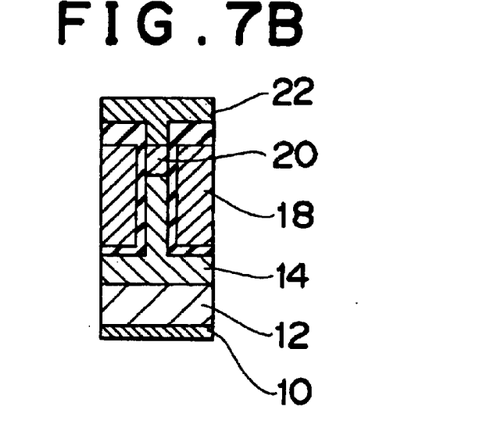
FIG. 7B is a sectional view of the semiconductor device according to the embodiment of the present invention taken along line 7B—7B in FIG. 7A.
Figure 7C:
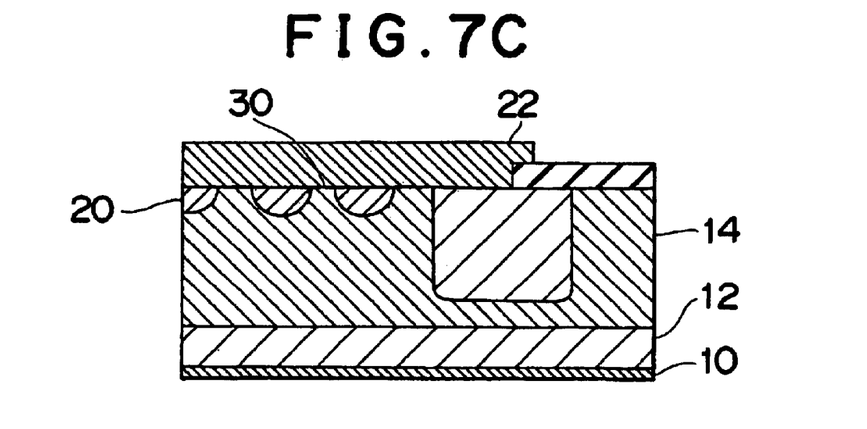
FIG. 7C is a sectional view of the semiconductor device according to the embodiment of the present invention taken along line 7C—7C in FIG. 7A.

It is also favorable to form a Schottky junction between the source electrode 22 and the n-type channel region 14a instead of the $p^+$-type source region 21 for drawing the holes to the source electrode. FIG. 7A illustrates a plan view of such a construction (the source electrode is omitted). FIG. 7B is a cross-section taken along line 7B—7B in FIG. 7A, and FIG. 7C is a cross-section taken along line 7C—7C in FIG. 7A. As seen from the comparison between FIG. 1C and FIG. 7C, the $p^+$-type source region 21 is not present in FIG. 7C, and the source electrode 22 (aluminum or the like) and the n-type channel region 14a are joined at a junction 30 by a Schottky junction. This makes it possible to omit a forming process of the $p^+$-type source region 21.

Figure 8:
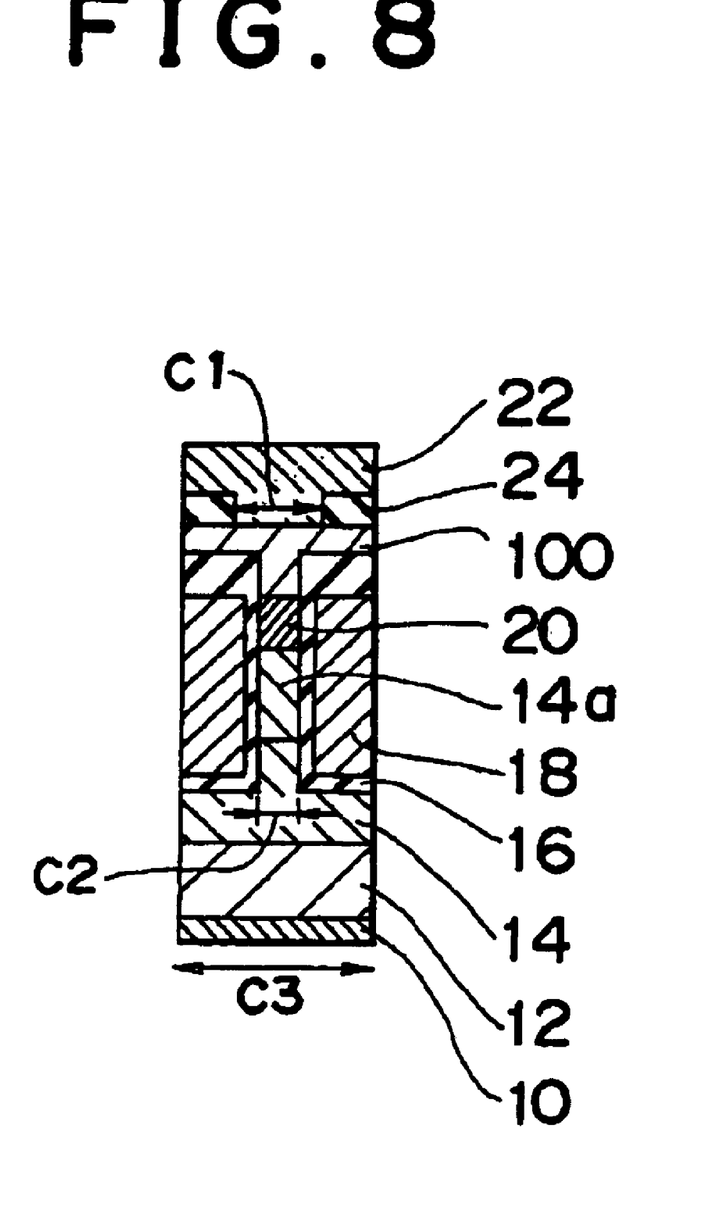
FIG. 8 is a sectional view of a semiconductor device according to an embodiment of the present invention.

Also, as shown in FIG. 8, an $n^+$-type extension region 100 and an insulating layer 24 may be provided on the $n^+$-type region 20 for contact with the source electrode 22. In this case, a contact opening width c1 of the source electrode 22 may be made greater than a gate distance c2. As a result, it is possible to reduce a cell width c3 of a transistor in the present embodiment, and therefore it is possible to reduce the ON resistance by increasing the transistor density. Further, it is also possible to reduce the contact resistance by increasing a contact area, because a contact (source contact) opening is formed on the $n^+$-type extension region 100.

It is also possible to change the resistance of the $n^+$-type extension region 100 by adjusting the $n^+$-type extension region 100 material or an impurity concentration therein. Accordingly, an appropriate source resistance is formed which allows automatic adjusting of a current balance between the transistors. That is, when the source current of a transistor increases, the source voltage increases accordingly by the properly adjusted source resistance. This results in decreased voltage between the gate and the source, and a negative feedback occurs where the source current decreases. As a result, the current value of that transistor can be automatically adjusted.

Also, in the above-described embodiment, the thickness of the gate insulating film formed at an upper portion of the trench gate may be greater than the thickness of the gate insulating film formed on a side portion thereof. Insulation of the gate electrode is maintained even when the source voltage is applied via a region extended from the source region by thickening an upper portion of the gate insulating film. This ensures activation of the semiconductor.

Figure 9A:
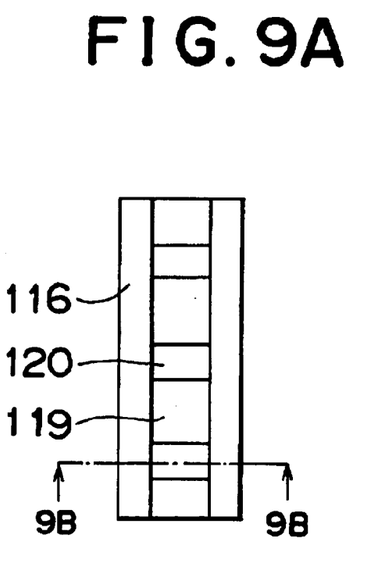
FIG. 9A is a plan view of a semiconductor device according to an embodiment of the present invention.
Figure 9B:
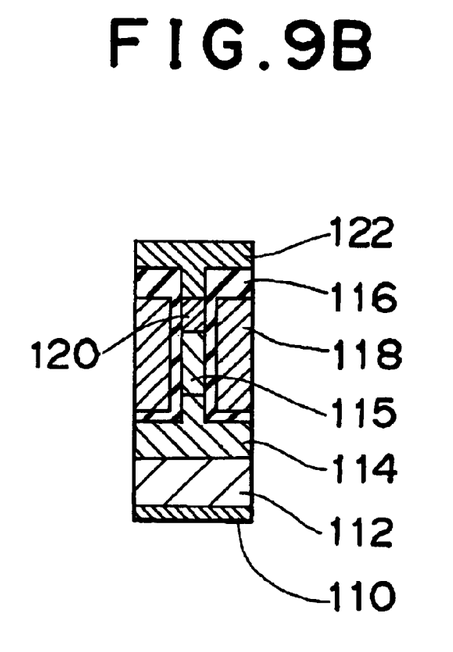
FIG. 9B is a sectional view of the semiconductor device according to the embodiment of the present invention taken along line 9B—9B in FIG. 9A.

FIG. 9A shows a plan view of a semiconductor device according to a second embodiment of the present invention. FIG. 9B is a sectional view taken along line 9B—9B in FIG. 9A. An n-type drift region 114 is provided on an $n^+$-type substrate 112, which is provided on a drain electrode 110. A $p^-$-type channel region 115 is provided on the n-type drift region 114 and is sandwiched between trench gates 118 from both sides via insulation films 116. An $n^+$-type source region 120 is formed on the $p^-$-type channel region 115 and is in contact with a source electrode 122. The present embodiment differs from the above-mentioned first embodiment in substrate and conductive type.

Here, the $p^-$-type channel region 115 is formed by epitaxial growth, for example, instead of ion implantation. Further, an impurity concentration contained in the channel is set equal to or less than the impurity concentration in the n-type drift region 114. This enables depletion of the entire channel even when a space between trench gates 118 is large.

When a positive bias voltage is, applied to the trench gate 118, the channel is formed not only at the interface on the trench gate side, but it is formed over the entire $p^-$-type channel region 115. Therefore, the effect of interface state is small, and a resistance of the channel can be restricted at a low level.

Further, in the present embodiment, a $p^+$-type region 119 is formed for drawing holes from the $p^-$-type channel region 115 to the source electrode 122. The $p^+$-type region 119 is formed alternately with the $n^+$-type source region 120, as shown in FIG. 9A.

Figure 10A:
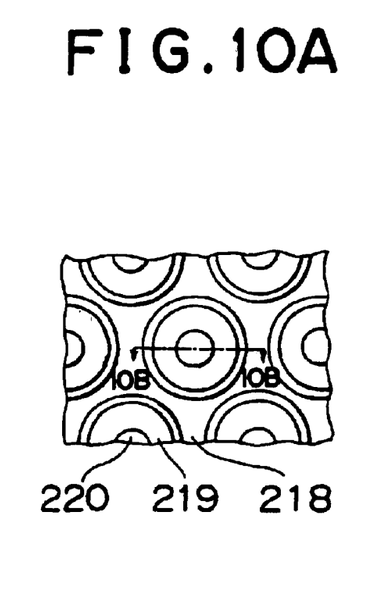
FIG. 10A is a plan view of a semiconductor device according to an embodiment of the present invention.
Figure 10B:
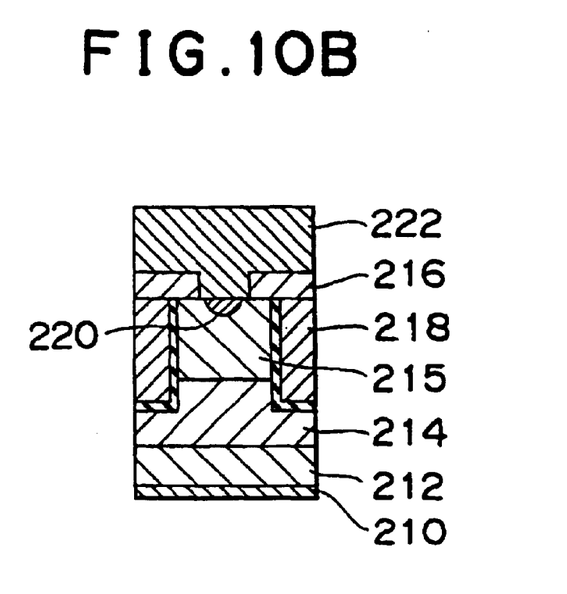
FIG. 10B is a sectional view of the semiconductor device according to the embodiment of the present invention taken along line 10B—10B in FIG. 10A.

FIG. 10A and FIG. 10B are plan views of a semiconductor device according to a third embodiment of the present invention (source electrode is omitted). FIG. 10B is a sectional view taken along line 10B—10B in FIG. 10A. Elements 210, 212, 214, 216 and 220 are similar to elements 110, 112, 114, 116 and 120, respectively, previously described Construction of the present embodiment differs from that of the above-mentioned embodiment in that a source region 220 is formed at almost a center of a $p^-$-type channel region 215. The source region 220 is isolated from the insulation film 216. Due to the fact that a channel in the semiconductor device of the present invention is formed over an entire channel region, it is not necessary to dispose a source region for supplying electrons from a source electrode adjacent to a trench gate. As a result, as shown in FIG. 10B, it is possible to dispose the source region at a center of the channel region.

Disposing the source region at the center of the channel region as described above enables disposing of a $p^+$-type source region 219 at a position adjacent to a trench gate 218. As a result, a high speed switching from ON operation to OFF operation by quickly drawing holes is made possible. Also, it is easy to make an area of the $p^+$-type source region 219 larger than an area of the $n^+$-type source region 220.

In FIG. 10A, shapes of the $p^+$-type source region 219 and an $n^+$-type source region 220 may be polygonal instead of circular.

Figure 11A:
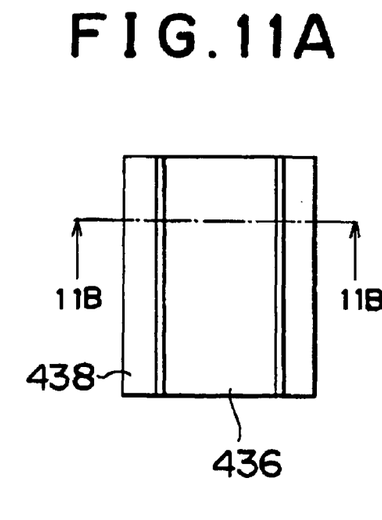
FIG. 11A is a plan view of a semiconductor device according to an embodiment of the present invention.
Figure 11B:
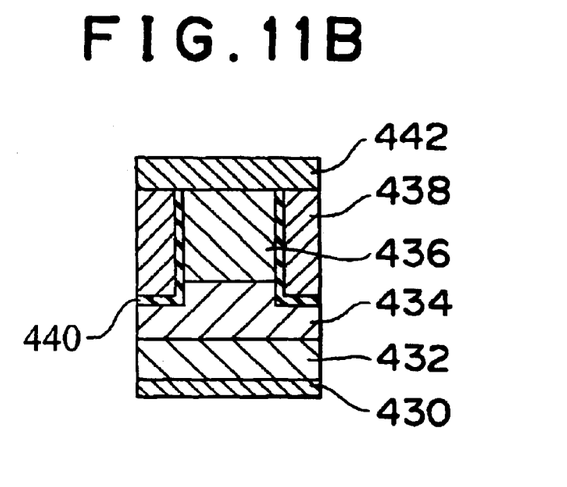
FIG. 11B is a sectional view of the semiconductor device according to the embodiment of the present invention taken along line 11B—11B in FIG. 11A.

Next, a semiconductor according to a fourth embodiment of the present invention will be shown. The present embodiment is a Schottky diode, and FIG. 11A and FIG. 11B illustrate a plan view (anode electrode is omitted) and a sectional view, respectively. An $n^-$-type cathode region 434 and an n⁻-type channel region 436 are provided sequentially on an n⁺-type cathode region 432. The n⁻-type channel region 436 is provided between a trench structure 438 insulated by an oxide film 440. An anode electrode 442 is joined on the n⁻-type channel region 436 by a Schottky connection. The anode electrode 442 and the trench structure 438 are coupled by ohmic contact, so that their potentials are equal. Also, a cathode electrode 430 is connected on a surface opposite from a n⁺-type cathode region 432.

An impurity concentration in an n⁻-type channel region 436 is equal to or less than that in an n⁻-type cathode region 434. Therefore, depletion of an entire channel is made easier even when a space of the trench structure 438 is comparatively large. Accordingly, depletion of the entire n⁻-type channel region 436 is possible in a state where zero bias is applied (short-circuited) to the trench structure 438 and the anode electrode 442 by setting the gate space in accordance with the concentration of the n⁻-type channel region 436. As a result, a high voltage Schottky diode can be obtained.

It is also possible to use the p⁻-type channel region instead of the n⁻-type channel region 436. In such case, it is possible to set a larger space of the trench structure 438.

Figure 12:
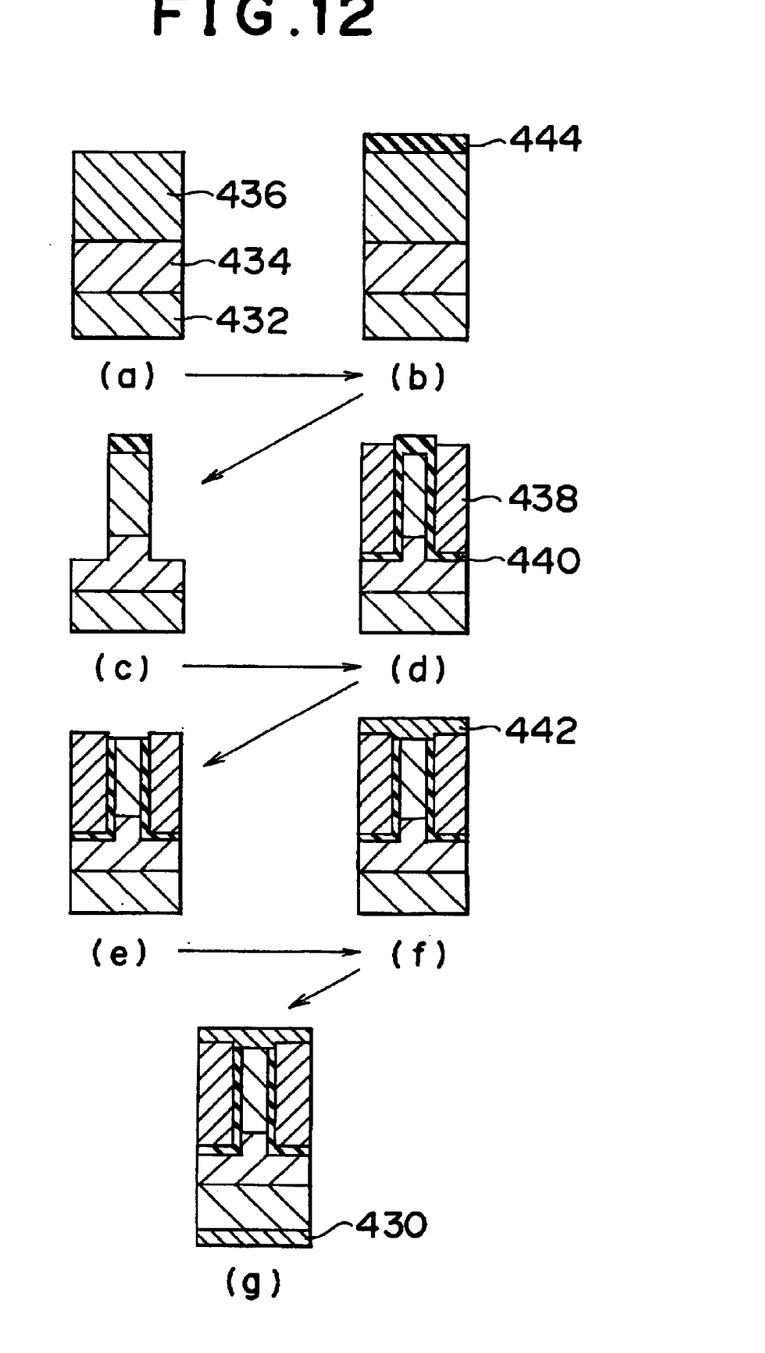
FIG. 12 is an explanatory drawing indicating a manufacturing method of an embodiment of the present invention.

FIG. 12 illustrates a manufacturing method of the semiconductor device according to the present embodiment. First, the n⁻-type cathode region 434 and the n⁻-type channel region 436 are epitaxially grown on the n⁺-type cathode region 432 (a). Next, a surface is thermally oxidized to form an oxide film 440 of approximately 500 nm (b). Then, the oxide film 440 is dry etched in a photolithography process using mask to form a trench (c).

Then, a side wall of the trench is thermally oxidized for approximately 50 nm, and the oxide film is removed by hydrofluoric acid. Further, the trench side wall is etched by chemical dry etching for approximately 50 nm, and approximately 100 nm of oxide film 440 is formed by thermal oxidation. Then, the trench is filled with polycrystalline silicon to form the trench structure 438 (d).

Next, a surface of the oxide film 440 is removed by dry etching (e). Then, the anode electrode 442 (aluminum, for example) is formed using a sputtering method. The anode electrode 442 is processed into a desired shape by photolithography and etching. Then, a Schottky connection is formed between the n⁻-type channel 436 by heat treatment at 420° C. for 30 minutes, while an ohmic contact is formed between the trench structure 438 (f). Lastly, the cathode electrode 430 (Ti, Ni, Au, for example) is formed by a sputtering method (g).

Figure 13:
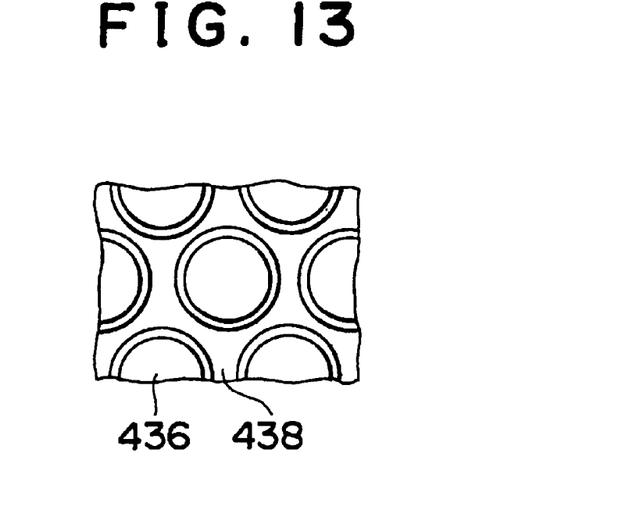
FIG. 13 is a plan view of a semiconductor device according to an embodiment of the present invention.

Further, in the present embodiment, it is possible to form the n⁻-type channel (or the p⁻-type channel) region 436 so that a planar shape thereof is circular as shown in FIG. 13 instead of rectangular.

Although only a Schottky diode has been explained for the present embodiment, the present invention is similarly applicable to junction diodes.

Figure 14A:
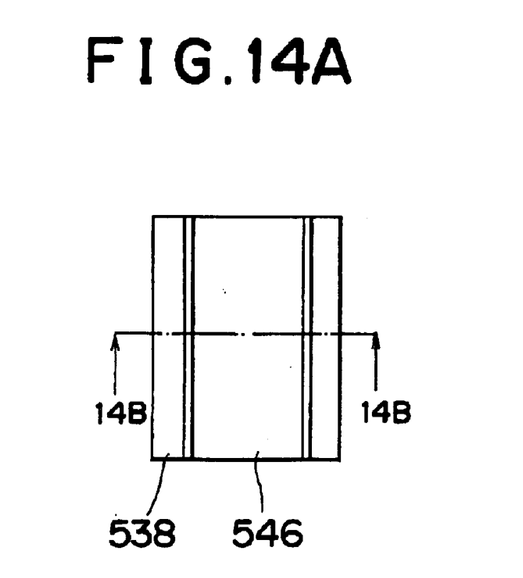
FIG. 14A is a plan view of a semiconductor device according to an embodiment of the present invention.
Figure 14B:
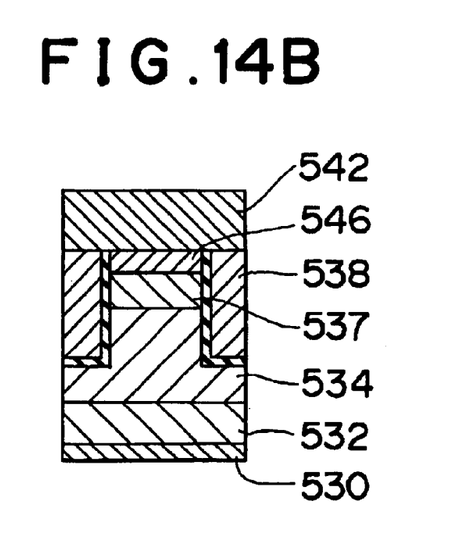
FIG. 14B is a sectional view of the semiconductor device according to the embodiment of the present invention taken along line 14B—14B in FIG. 14A.

FIG. 14A and FIG. 14B are block diagrams illustrating the case when the present invention is applied to a junction diode. FIG. 14A is a plan view (anode electrode is omitted) and FIG. 14B is a sectional view taken along line 14B—14B in FIG. 14A. On one surface of an n⁺-type cathode region 532 is formed a cathode electrode 530. On the other surface are formed, an n- cathode region 534, a p⁻-type anode region 537, and a p⁺-type anode region 546. The p⁻-type anode region 537 and the p⁺-type anode region 546 are formed between the trench structure 538. An anode electrode 542 is formed on the p⁺-type anode region 546 and the trench structure 538, and is short-circuited. Providing a low concentration p⁻-type anode region 537 makes it possible to pinch off the entire p⁻-type anode region 537 when applying reverse bias at comparatively wide trench structure 538 space, resulting in high voltage.

In the present embodiment, it is also possible to provide an n⁻-type anode region having a concentration equal to or less than the n⁻-type cathode region 534 instead of the p⁻-type anode region 537.

As described above, according to the present invention, a semiconductor device with low ON resistance or high voltage can be obtained.

The present invention is not limited to the semiconductors in the aforementioned embodiments, but it is also applicable to MOSFET, thyristor, SIT, and the like. Also, metal electrode materials may include tungsten (W), molybdenum (Mo), and the like, in addition to those referred to in the embodiment. The metal material being single layer of multilayer films.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A bipolar semiconductor device comprising:

a drain electrode;

a drain region having a first conductive type semiconductor and disposed on the drain electrode;

a drift region having a second conductive type semiconductor different from the first conductive type semiconductor of the drain region and disposed on the drain region;

a channel region having the second conductive type semiconductor and disposed on the drift region;

a gate region surrounding at least a part of the channel region via an insulation film, the gate region having the first conductive type semiconductor;

a source region having the second conductive type semiconductor provided on the channel region, the source region is located substantially at a center of the channel region, and the source region is isolated from the insulation film; and a source electrode connected to the source region, wherein a depletion layer is formed over most of the entire channel region when a predetermined voltage is applied to the gate region.

2. The semiconductor device according to claim 1, further comprising a semiconductor region having the first conductive type semiconductor and provided between the channel region and the source electrode.

3. A bipolar semiconductor device comprising:

a drain electrode;

a drain region having a first conductive type and disposed on the drain electrode;

a drift region having a second conductive type different from the first conductive type and disposed on the drain region;

a channel region having the second conductive type and disposed on the drift region;

a gate region surrounding at least a part of the channel region via an insulation film, the gate region having the first conductive type;

a source region having the second conductive type provided on the channel region, the source region is located substantially at a center of the channel region, and the source region is isolated from the insulation film; and a source electrode connected to the source region, wherein at least a part of the source electrode forms a Schottky junction with the channel region.

4. A bipolar semiconductor device comprising:

a drain electrode;

a drain region having a first conductive type and disposed on the drain electrode;

a drift region having a second conductive type different from the first conductive type and disposed on the drain region;

a channel region having the second conductive type and disposed on the drift region;

a gate region surrounding at least a part of the channel region via an insulation film, the gate region having the first conductive type;

a source region having the second conductive type provided on the channel region, the source region is located substantially at a center of the channel region, and the source region is isolated from the insulation film;

a source electrode connected to the source region; and a semiconductor layer having the second conductive type located between the source region and the source electrode, the semiconductor layer including an end face extended to a position covering at least a portion of the gate region.

5. A semiconductor device comprising:

a first cathode region having a first conductive type;

a second cathode region having the first conductive type and disposed on the first cathode region;

a first anode region having a second conductive type and provided on the second cathode region;

a trench structure provided so as to surround at least the first anode region via an insulation film; and a second anode region having the second conductive type and provided on the first anode region, where an impurity concentration in the first anode region is low to effect pinch off of the first anode region when a reverse bias is applied to the trench structure.

* * * * *